US008963622B2

(12) United States Patent
Lee et al.

(10) Patent No.: US 8,963,622 B2
(45) Date of Patent: Feb. 24, 2015

(54) METHOD AND APPARATUS FOR GENERATING REGULATED ISOLATION SUPPLY VOLTAGE

(71) Applicant: Microchip Technology Incorporated, Chandler, AZ (US)

(72) Inventors: Thomas Youbok Lee, Chandler, AZ (US); Rudy Jaramillo, Gilbert, AZ (US); Patrick Kelly Richards, Peoria, AZ (US); Lee Furey, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 14/200,533

(22) Filed: Mar. 7, 2014

(65) Prior Publication Data

US 2014/0253225 A1    Sep. 11, 2014

Related U.S. Application Data

(60) Provisional application No. 61/775,669, filed on Mar. 10, 2013.

(51) Int. Cl.
*G11C 5/14* (2006.01)

(52) U.S. Cl.
USPC ............................ 327/530; 323/282; 327/565

(58) Field of Classification Search
USPC .................. 327/530, 538, 564–566; 323/282
See application file for complete search history.

(56) References Cited

U.S. PATENT DOCUMENTS

| 6,442,213 | B1 | 8/2002 | Krone et al. ................... 375/285 |
| 8,345,458 | B2 * | 1/2013 | Shiraishi et al. ............... 363/144 |
| 8,422,261 | B2 * | 4/2013 | Hashimoto et al. ............ 363/147 |
| 2009/0206960 | A1 | 8/2009 | Ng et al. ........................ 333/247 |
| 2010/0253306 | A1 * | 10/2010 | Shiraishi et al. ............... 323/282 |
| 2012/0068306 | A1 | 3/2012 | Song et al. ..................... 257/532 |

FOREIGN PATENT DOCUMENTS

WO    2008/114073 A1    9/2008    ............. H01L 27/00

OTHER PUBLICATIONS

International Search Report and Written Opinion, Application No. PCT/US2014/022183, 10 pages, Jul. 1, 2014.

* cited by examiner

*Primary Examiner* — Quan Tra
(74) *Attorney, Agent, or Firm* — King & Spalding L.L.P.

(57) ABSTRACT

High voltage rated isolation capacitors of inductors are formed on a face of a primary integrated circuit die. The isolation capacitors or inductors AC couple the primary integrated circuit in a first voltage domain to a second integrated circuit in a second voltage domain. The isolation capacitors or inductors DC isolate the primary integrated circuit from the second integrated circuit die. Isolated power transfer from the first voltage domain to the second voltage domain is provided through the high voltage rated isolation capacitors or inductors with an AC oscillator or PWM generator. The AC oscillator voltage amplitude may be increased for an increase in power through the high voltage rated isolation capacitors or inductors.

30 Claims, 12 Drawing Sheets

| Capacitor (pF) | Voltage (V) | Frequency (MHz) | Current (mA) |
|---|---|---|---|
| 10 | 5 | 0 | 0.0 |
| 10 | 5 | 10 | 3.2 |
| 10 | 5 | 20 | 6.3 |
| 10 | 5 | 30 | 9.5 |
| 10 | 5 | 40 | 12.6 |
| 10 | 5 | 50 | 15.7 |
| 10 | 5 | 60 | 18.9 |
| 10 | 5 | 70 | 22.0 |
| 10 | 5 | 80 | 25.2 |
| 10 | 5 | 90 | 28.3 |
| 10 | 5 | 100 | 31.4 |
| 10 | 5 | 110 | 34.6 |
| 10 | 5 | 120 | 37.7 |
| 10 | 5 | 130 | 40.9 |
| 10 | 5 | 140 | 44.0 |
| 10 | 5 | 150 | 47.2 |
| 10 | 5 | 160 | 50.3 |
| 10 | 5 | 170 | 53.4 |
| 10 | 5 | 180 | 56.6 |
| 10 | 5 | 190 | 59.7 |
| 10 | 5 | 200 | 62.9 |

$$i = C\frac{dV}{dt} = 2\pi f V C$$

METHOD AND APPARATUS FOR GENERATING REGULATED ISOLATION SUPPLY VOLTAGE

RELATED PATENT APPLICATION

This application claims priority to commonly owned U.S. Provisional Patent Application Ser. No. 61/775,669; filed Mar. 10, 2013; which is hereby incorporated by reference herein for all purposes.

TECHNICAL FIELD

The present disclosure relates to high voltage isolation, in particular to integrated high voltage isolation for generating a regulated supply voltage.

BACKGROUND

Many applications require isolation of different supply voltages, in particular isolation of reference potentials such as ground potentials in different voltage domains. Thus, the demand for isolated supply voltage is increasing. In recent industrial applications, the need for electrical isolation, both Galvanic and direct current (DC)-to-DC, is increasing for both data communication and DC supply voltages, e.g., at differing ground potentials. The typical isolation application has been mainly for data communications across an isolation barrier. But in recent years, applications are demanding that the isolation device (for data communication) also include isolated DC-to-DC energy transfer capabilities as well.

Typical electrical isolation methods may include: optical, inductive, e.g., using alternating current (AC) through a transformer or electromagnetic radio frequencies, capacitor (capacitor is a very good galvanic isolator), etc. Optical couplers have been the dominant signal isolation device but are limited to slow data rates (less than 1 MHz) and are bulky to integrate. Moreover, the optical coupler is not capable of passing isolated DC power. Inductive and capacitive isolation implementations provide for high data rates, offer electrically isolated power transfer, and are low-cost to manufacture. Demand is very high for Galvanic isolation between devices in different voltage domains to have isolation of, for example, 1 kVrms, 2.5 kVrms, 4 kVrms, etc.

SUMMARY

Therefore, a need exists for power transfer between two different voltage domains that maintains isolation between the two different voltage domains while generating a regulated supply voltage to a device in one of those voltage domains.

According to an embodiment, a method for generating regulated isolation supply voltage between different voltage domains may comprise the steps of: providing a primary integrated circuit coupled to a first voltage domain; providing a secondary integrated circuit coupled to a second voltage domain; providing a first insulating layer over at least a portion of a face of the primary integrated circuit; providing a plurality of high voltage rated isolation capacitors positioned over the first insulating layer, wherein each of the plurality of high voltage rated isolation capacitors may comprise a first electrically conductive layer on the first insulating layer, a high voltage rated dielectric layer on a portion of a respective first electrically conductive layers, and a second electrically conductive layer on the respective high voltage rated dielectric layer; providing a waveform generator in the primary integrated circuit die, the waveform generator having outputs coupled to respective ones of the first electrically conductive layers; providing an alternating current (AC)-to-direct current (DC) converter in the secondary integrated circuit and having inputs coupled to respective ones of the second electrically conductive layers, whereby AC power may be transferred from the waveform generator to the AC-to-DC converter; providing a voltage regulator coupled to an output of the AC-to-DC converter, the voltage regulator having a reference voltage feedback output; and providing a pulse width modulator having an input coupled to the voltage regulator reference voltage feedback output and an output coupled to another second electrically conductive layer, wherein the waveform generator may have a control input coupled to a respective another first electrically conductive layer, whereby the pulse width modulator may control the output of the waveform generator.

According to another embodiment, a method for generating regulated isolation supply voltage between different voltage domains may comprise the steps of: providing a primary integrated circuit coupled to a first voltage domain; providing a secondary integrated circuit coupled to a second voltage domain; providing a first insulating layer over at least a portion of a face of the primary integrated circuit; providing a plurality of high voltage rated isolation transformers positioned over the first insulating layer, wherein each of the plurality of high voltage rated isolation transformers may comprise a first inductor on the first insulating layer, a high voltage rated dielectric layer on a portion of a respective first inductor, and a second inductor on the respective high voltage rated dielectric layer; providing a waveform generator in the primary integrated circuit die, the waveform generator having outputs coupled to respective ones of the first inductor; providing an alternating current (AC)-to-direct current (DC) converter in the secondary integrated circuit and having inputs coupled to respective ones of the second inductor, whereby AC power may be transferred from the waveform generator to the AC-to-DC converter; providing a voltage regulator coupled to an output of the AC-to-DC converter, the voltage regulator having a reference voltage feedback output; and providing a pulse width modulator having an input coupled to the voltage regulator reference voltage feedback output and an output coupled to another second inductor, wherein the waveform generator may have a control input coupled to a respective another first inductor, whereby the pulse width modulator may control the output of the waveform generator.

According to yet another embodiment, an integrated circuit device having regulated isolation supply voltage between different voltage domains may comprise: a primary integrated circuit coupled to a first voltage domain; a secondary integrated circuit coupled to a second voltage domain; a first insulating layer over at least a portion of a face of the primary integrated circuit; a plurality of high voltage rated isolation capacitors positioned over the first insulating layer, wherein each of the plurality of high voltage rated isolation capacitors may comprise According to an embodiment, a first electrically conductive layer on the first insulating layer, a high voltage rated dielectric layer on a portion of a respective first electrically conductive layers, and a second electrically conductive layer on the respective high voltage rated dielectric layer; a waveform generator in the primary integrated circuit die, the waveform generator having outputs coupled to respective ones of the first electrically conductive layers; an alternating current (AC)-to-direct current (DC) converter in the secondary integrated circuit and having inputs coupled to respective ones of the second electrically conductive layers, whereby AC power may be transferred from the waveform generator to the AC-to-DC converter; a voltage regulator coupled to an output of the AC-to-DC converter, the voltage regulator having a reference voltage feedback output; and a pulse width modulator having an input coupled to the voltage regulator reference voltage feedback output and an output coupled to another second electrically conductive layer, wherein the waveform generator may have a control input coupled to a respective another first electrically conductive layer, whereby the pulse width modulator may control the output of the waveform generator.

According to a further embodiment, push-pull drivers may be provided in the primary integrated circuit die, having inputs coupled to the waveform generator and outputs coupled to respective ones of the first electrically conductive layers. According to a further embodiment, a second insulating layer may be provided over at least a portion of the second electrically conductive layers, over portions of the high voltage rated dielectric layers and the first electrically conductive layers, wherein the second insulating layer may have first openings over the first electrically conductive layers for first bond wires to couple the first electrically conductive layers to circuit connection pads on the primary integrated circuit, and second openings over the second electrically conductive layers for second bond wires to couple the second electrically conductive layers to circuit connection pads on the secondary integrated circuit.

According to a further embodiment, an integrated circuit package may encapsulate the primary and secondary integrated circuit and the high voltage rated isolation capacitors. According to a further embodiment, the primary integrated circuit may be a microcontroller. According to a further embodiment, the high voltage rated dielectric layer may comprise silicon dioxide ($SiO_2$). According to a further embodiment, the high voltage rated dielectric layer may comprise silicon nitride (SiN). According to a further embodiment, the high voltage rated dielectric layer may comprise Oxynitride. According to a further embodiment, the high voltage rated dielectric layer may comprise stacked layers of doped or undoped oxides of different thicknesses and deposited or grown by standard techniques. According to a further embodiment, the high voltage rated dielectric layers each have a thickness of about four (4) microns (μ). According to a further embodiment, the high voltage rated isolation capacitors each have a capacitance value of about 10 picofarads.

According to a further embodiment, the first and second electrically conductive layers may be metal. According to a further embodiment, the first and second electrically conductive metal layers may be comprised of aluminum. According to a further embodiment, the first and second electrically conductive layers may be comprised of copper. According to a further embodiment, the first and second electrically conductive layers may be selected from any one or more of the group consisting of titanium, tantalum, cobalt, molybdenum, and silicides and salicides thereof.

According to a further embodiment, each of the outputs of the push-pull drivers may be coupled to at least two of the first electrically conductive layers, and corresponding at least two second electrically conductive layers may be coupled to the AC-to-DC converter. According to a further embodiment, the waveform generator may be an oscillator and the pulse width modulator may control the output amplitude thereof. According to a further embodiment, the waveform generator may be an oscillator and the pulse width modulator may control the output frequency thereof.

According to a further embodiment, a voltage multiplier may be coupled between a voltage source in the first voltage domain and supplying a multiplied operating voltage to the push-pull drivers. According to a further embodiment, the voltage multiplier multiplies the voltage source by two. According to a further embodiment, the voltage multiplier multiplies the voltage source by three. According to a further embodiment, the AC-to-DC converter may comprise a low pass filter. According to a further embodiment, the AC-to-DC converter may comprise a voltage doubler. According to a further embodiment, the waveform generator may comprise power switches and the pulse width modulator may control on and off duty cycles of the power switches.

According to still another embodiment, an integrated circuit device having regulated isolation supply voltage between different voltage domains may comprise: a primary integrated circuit coupled to a first voltage domain; a secondary integrated circuit coupled to a second voltage domain; a first insulating layer over at least a portion of a face of the primary integrated circuit; a plurality of high voltage rated isolation transformers positioned over the first insulating layer, wherein each of the plurality of high voltage rated isolation transformers may comprise a first inductor on the first insulating layer, a high voltage rated dielectric layer on a portion of a respective first inductor, and a second inductor on the respective high voltage rated dielectric layer; a waveform generator in the primary integrated circuit die, the waveform generator having outputs coupled to respective ones of the first inductor; an alternating current (AC)-to-direct current (DC) converter in the secondary integrated circuit and having inputs coupled to respective ones of the second inductor, whereby AC power may be transferred from the waveform generator to the AC-to-DC converter; a voltage regulator coupled to an output of the AC-to-DC converter, the voltage regulator having a reference voltage feedback output; and a pulse width modulator having an input coupled to the voltage regulator reference voltage feedback output and an output coupled to another second inductor, wherein the waveform generator may have a control input coupled to a respective another first inductor, whereby the pulse width modulator may control the output of the waveform generator.

According to a further embodiment, push-pull drivers may be provided in the primary integrated circuit die, having inputs coupled to the waveform generator and outputs coupled to respective ones of the first inductors. According to a further embodiment, a second insulating layer may be provided over at least a portion of the second inductors, over portions of the high voltage rated dielectric layers and the first inductors, wherein the second insulating layer may have first openings over the first electrically conductive layers for first bond wires to couple the first inductors to circuit connection pads on the primary integrated circuit, and second openings over the second electrically conductive layers for second bond wires to couple the second inductors to circuit connection pads on the secondary integrated circuit.

According to a further embodiment, an integrated circuit package may encapsulate the primary and secondary integrated circuit and the high voltage rated isolation transformers. According to a further embodiment, the primary integrated circuit may be a microcontroller. According to a further embodiment, the high voltage rated dielectric layer may comprise silicon dioxide ($SiO_2$). According to a further embodiment, the high voltage rated dielectric layer may comprise silicon nitride (SiN). According to a further embodiment, the high voltage rated dielectric layer may comprise Oxynitride. According to a further embodiment, the high voltage rated dielectric layer may comprise stacked layers of doped or undoped oxides of different thicknesses and deposited or grown by standard techniques. According to a further embodiment, the high voltage rated dielectric layers each have a thickness of about four (4) microns (μ). According to a further embodiment, the AC-to-DC converter may comprise a low pass filter. According to a further embodiment, the waveform generator may comprise power switches and the pulse width modulator may control on and off duty cycles of the power switches.

BRIEF DESCRIPTION OF THE DRAWINGS

A more complete understanding of the present disclosure may be acquired by referring to the following description taken in conjunction with the accompanying drawings wherein.

Figure 1:
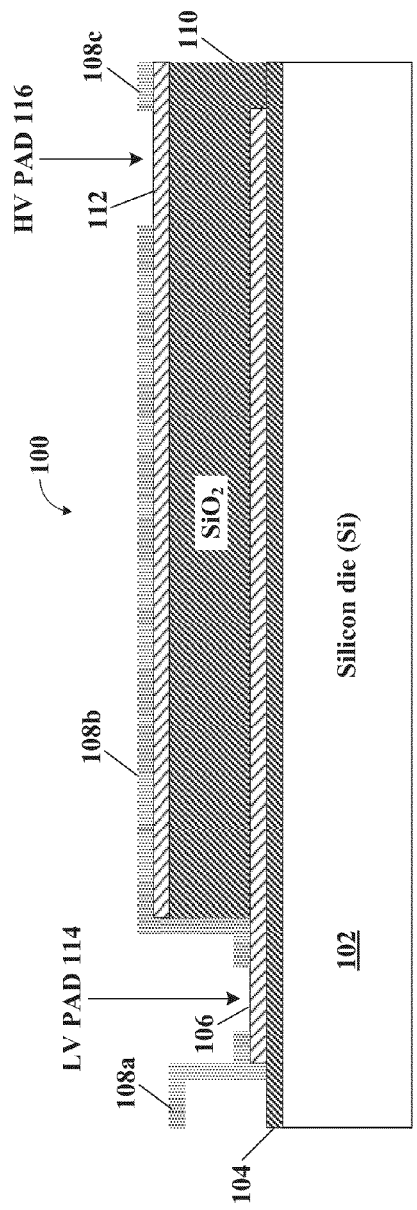
FIGS. 1 and 1A illustrate schematic elevational view diagrams of a high voltage rated isolation capacitor formed on an integrated circuit, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments, an isolated supply voltage may be generated, which is electrically isolated from the primary supply source. Such a feature can become very demanding for modern electronic system design. DC-to-DC isolation and AC-to-DC isolation are the examples thereof. According to various embodiments: (a) a method of transferring power from the primary to the secondary side across an isolation barrier using capacitive or inductive couplings are proposed; and (b) a method of regulating the isolated secondary power is proposed using an isolated feedback network. For such an application, high voltage rated (>3,000 Vrms) silicon capacitors or transformer coupled inductors may be used to provide an electrical, e.g., Galvanic, isolation barrier between integrated circuits in different voltage domains.

According to various embodiments, a capacitive couplings for an isolation device may be fabricated that may provide for a about a 3,000 Vrms high-voltage rated capacitor or inductor. According to various embodiments, a method of creating low-cost high voltage rated capacitor or inductor are proposed that may be formed with a special electrode geometry using a $SiO_2$ dielectric insulator.

According to various embodiments, a DC-to-DC energy transfer may include: Converting DC energy ($V_{DD1}$) to variable oscillation frequency, or an adjustable PWM (from external or internal); Transferring AC energy across the isolation barrier using a capacitive or inductive media; create the secondary supply voltage ($V_{DD2}$) using rectifier+regulator; and remote monitoring of the regulated voltage of the secondary device. Oscillator output frequency (or PWM) may be auto-tuned based on a feedback signal from the secondary device (regulated voltage output level indicator).

To generate an isolation supply voltage using the primary DC energy over a galvanic isolation barrier, the secondary supply voltage (over the isolation barrier) may be generated by using the primary supply voltage via a capacitive or inductive energy coupling method.

According to an embodiment, the secondary supply has sufficient power (P=V*I) to provide the load current in the second voltage domain. The regulated isolated voltage may be designed to meet the maximum load current of devices connected thereto.

Further it will be disclosed how to inter-connect the isolation capacitors or inductors with other devices in a single integrated circuit package.

The following applications will be disclosed herein, but is not limited to the specific applications discussed in the various embodiments disclosed herein:

(a) How to transfer DC energy in a first voltage domain of a primary device to a second voltage domain of a secondary device that is separated by a high voltage isolation barrier,
(b) How to convert the primary device's DC power supply voltage to AC energy,
(c) How to transfer the AC energy to DC energy in the second voltage domain that is separated by an isolation barrier using inductive or capacitive coupling,
(d) How to regulate the secondary DC supply voltage, and
(e) Paralleling isolation capacitors, if necessary, to supply sufficient energy to power the secondary device.

Referring now to the drawings, the details of example embodiments are schematically illustrated. Like elements in the drawings will be represented by like numbers, and similar elements will be represented by like numbers with a different lower case letter suffix.

Figure 1A:
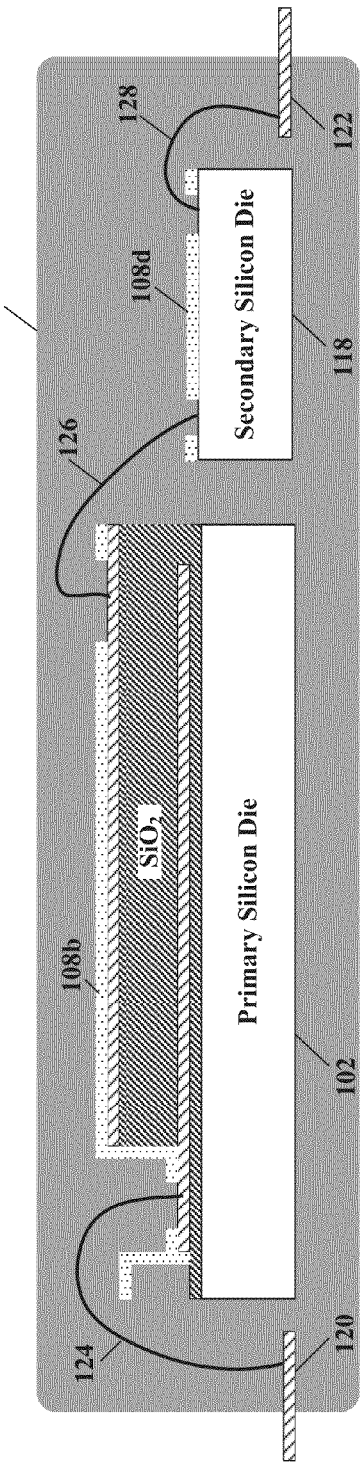

Referring to FIGS. 1 and 1A, depicted are schematic elevational view diagrams of a high voltage rated isolation capacitor formed on an integrated circuit, according to a specific example embodiment of this disclosure. A high voltage rated isolation capacitor, generally represented by the numeral 100, may comprise a first conductive layer 106, a second conductive layer 112, a high voltage rated dielectric (insulating) layer 110 between the first and second conductive layers 106 and 112, respectively, and an insulating layer 108, e.g., passivation, over the second conductive layer 112 and a portion of the first conductive layer 106. A first pad opening 114 may be used to provide electrical access to the first conductive layer 106. A second pad opening 116 may be used to provide electrical access to the second conductive layer 112. The high voltage rated isolation capacitor 100 may be positioned over and attached to an insulating layer 104 deposed on an integrated circuit 102.

At least one high voltage rated isolation capacitor 100 may be fabricated using a first mask to form the first conductive layer 106, and a second mask to form the second conductive layer 112 and the high voltage rated dielectric layer 110. A third mask may be used to form first and second pad openings 114 and 116, respectively, in the insulating (e.g., passivation) layer 108. It is contemplated and within the scope of this disclosure that other process fabrications steps may be used with equal success, and one having ordinary skill in the art of integrated circuit fabrication and the benefit of this disclosure could come up with such alternate designs and still be within the spirit and intent of this disclosure.

The first and second conductive layers 106 and 112, respectively, may comprise a conductive metallic material such as, for example but is not limited to, aluminum, copper, titanium, tantalum, cobalt, molybdenum, silicides and salicides thereof, etc. The insulating layer 104 may be, for example but is not limited to, silicon dioxide ($SiO_2$), silicon nitride (SiN), Oxynitride, or stacked layers of doped or undoped oxides of different thicknesses and deposited or grown by standard techniques, etc. The high voltage rated dielectric layer 110 may be, for example but is not limited to, silicon dioxide ($SiO_2$), silicon nitride (SiN), $SiO_xN_y$, oxide-nitride-oxide (ONO), etc. The thickness of the insulating dielectric layer 110 may determine the voltage withstand capabilities of the high voltage rated isolation capacitor 100, and may be, for example but is not limited to, about four (4) microns thick $SiO_2$ for about a 3,000 volt DC insulation breakdown voltage. The insulating layer 108 may be a protective passivation layer, e.g., silicon dioxide, silicon nitride, etc., having openings for connection to the low voltage pad 114 and the high voltage pad 116. The terms "high voltage pad" and "low voltage pad" refer to different voltage domains that have no direct current (DC) connections for either power, ground or signals. The voltage differences may be large or small between voltage domains, and further may be used for protection from and isolation of devices subject to large voltage transients, e.g., sensors subject to induced electromotive force (EMF) volts that may be caused by lightning, power switching transients, etc.

Referring now to FIG. 1A, the first conductive layer 106 of the high voltage rated isolation capacitor 100 assembly may be connected to lead fingers 120 and/or connection pads on the integrated circuit 102, hereinafter "primary IC 102," with bond wires 124. The conductive layer 112 of the high voltage rated isolation capacitor 100 assembly may be connected to connection pads on a second integrated circuit 118, hereinafter "secondary IC 118," and/or lead fingers 122 with bond wires 126. The secondary IC 118 may be connected to the lead fingers 122 with bond wires 128. The primary IC 102 may be configured to operate in a first voltage domain, and the secondary IC 118 may be configured to operate in a second voltage domain. The ground and voltage potentials between the first and second voltage domains may be thousands of volts different, only limited by the voltage withstand (breakdown) of the high voltage rated dielectric layer 110, e.g., thickness thereof. The lead fingers 120 may be coupled to the first voltage domain, and the lead fingers 122 may be coupled to the second voltage domain. The primary IC 102, the high voltage rated isolation capacitor 100, secondary IC 118, and portions of the lead fingers 120 and 122 may be encapsulated in an integrated circuit package 130, e.g., epoxy. Die paddles, if used, are not shown for illustrative clarity. It is contemplated and within the scope of this disclosure that other integrated circuit external connection nodes besides lead fingers may be used, e.g., ball bumps, etc.

Figure 1B:
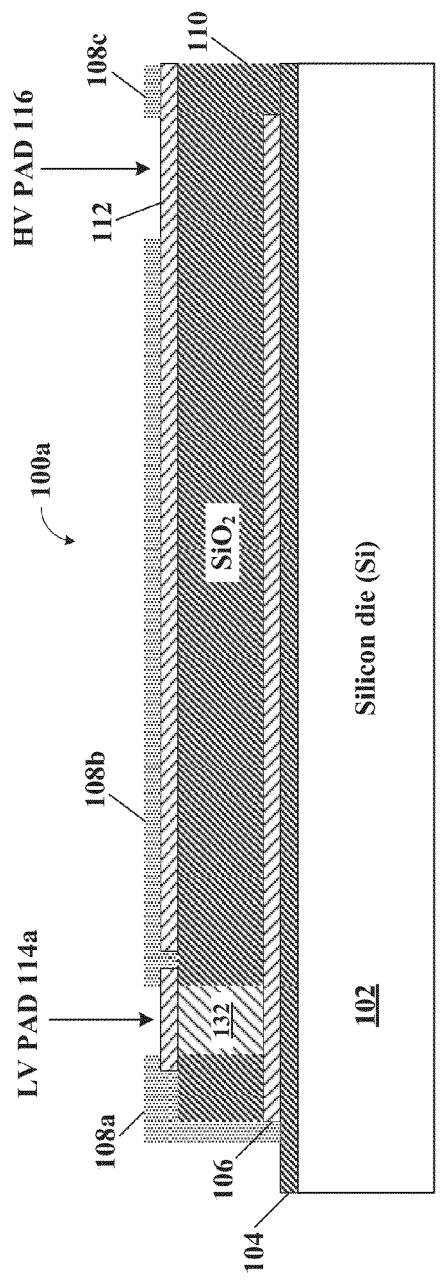
FIGS. 1B and 1C illustrate schematic elevational view diagrams of a high voltage rated isolation capacitor formed on an integrated circuit, according to another specific example embodiment of this disclosure.
Figure 1C:
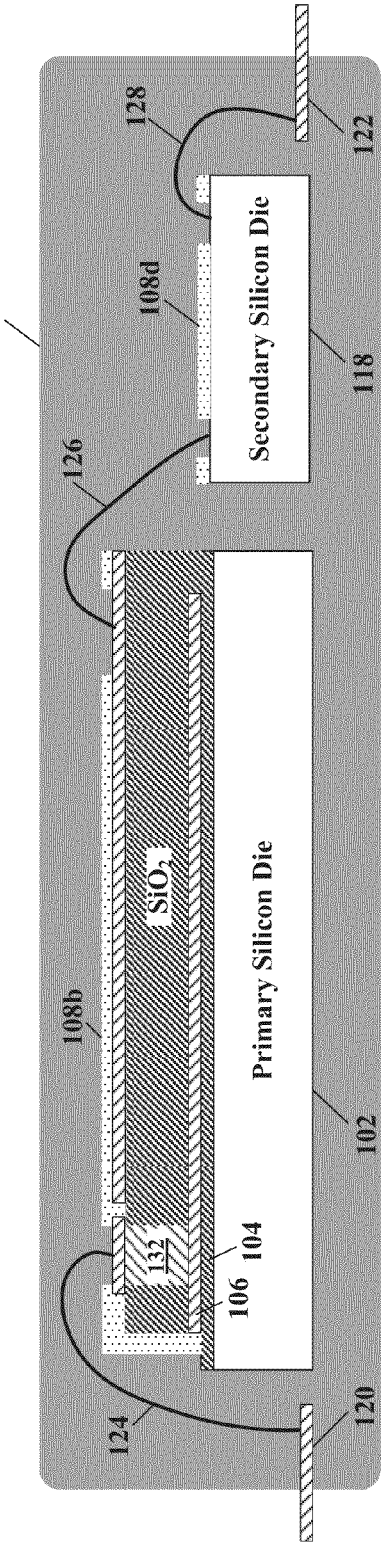

Referring to FIGS. 1B and 1C, depicted are schematic elevational view diagrams of a high voltage rated isolation capacitor formed on an integrated circuit, according to another specific example embodiment of this disclosure. A high voltage rated isolation capacitor, generally represented by the numeral 100a, may comprise a first conductive layer 106, a second conductive layer 112, a high voltage rated dielectric (insulating) layer 110 between the first and second conductive layers 106 and 112, respectively, and an insulating layer 108, e.g., passivation, over the second conductive layer 112 and a portion of the first conductive layer 106. Conductive material 132 may be used to fill in an opening in the high voltage rated dielectric layer 110 that may be over the first conductive layer 106. The conductive material 132 may be used to provide electrical access to the first conductive layer 106. A second pad opening 116 may be used to provide electrical access to the second conductive layer 112. The high voltage rated isolation capacitor 100a may be positioned over and attached to an insulating layer 104 deposed on an integrated circuit 102. Operation of the high voltage rated isolation capacitor 100a is substantially the same as operation of the high voltage rated isolation capacitor 100 described hereinabove.

Figure 1E:
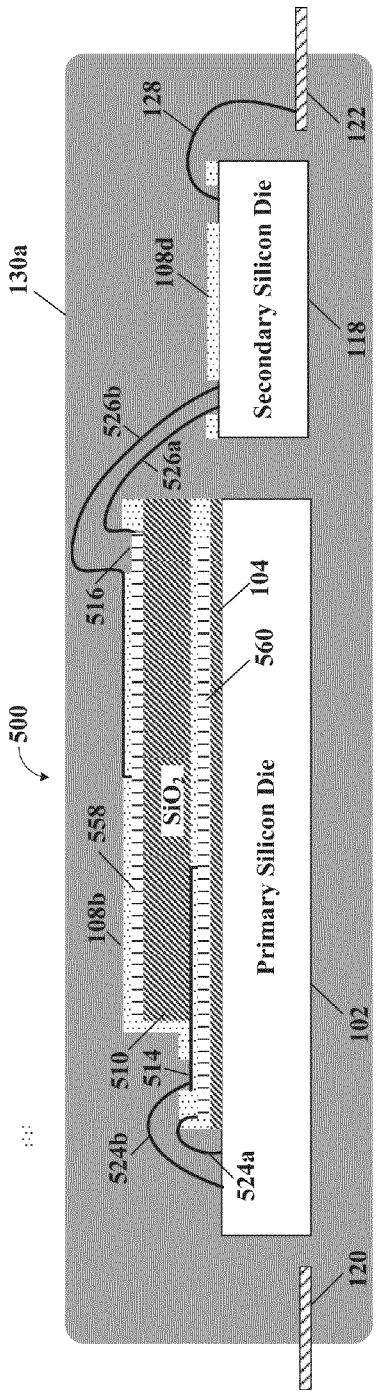
FIGS. 1D and 1E illustrate schematic elevational and plan view diagrams of high voltage rated isolation inductors formed on an integrated circuit, according to yet another specific example embodiment of this disclosure.
Figure 1D:
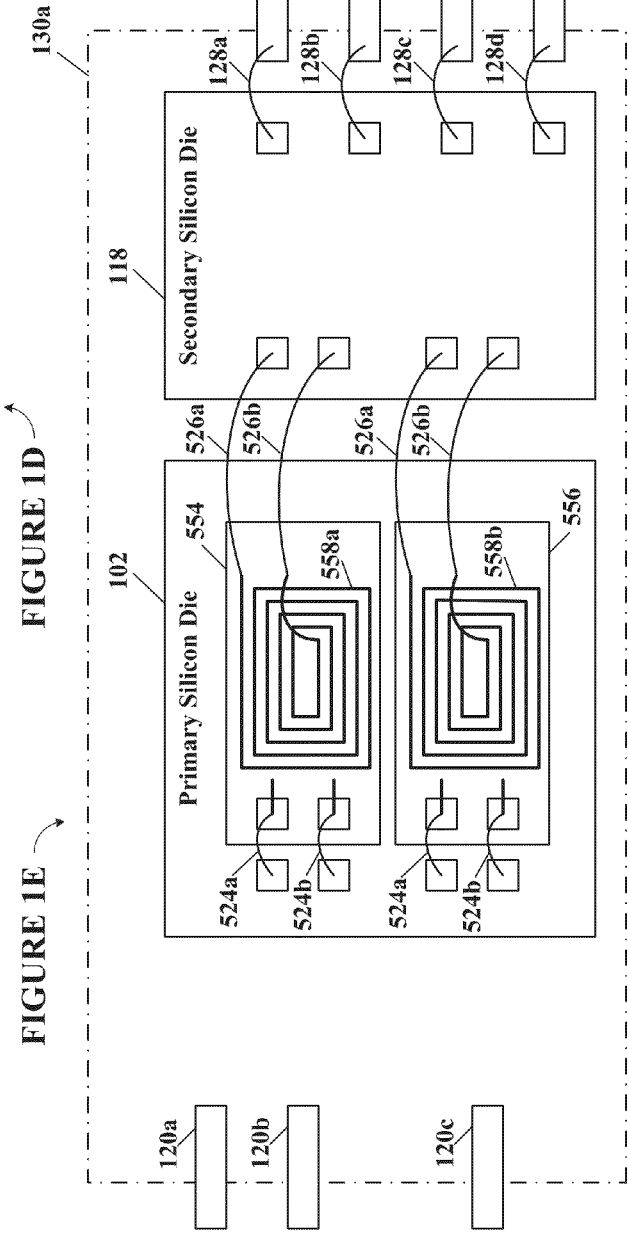

Referring to FIGS. 1D and 1E, depicted are schematic elevational and plan view diagrams of high voltage rated isolation inductors formed on an integrated circuit, according to another specific example embodiment of this disclosure. High voltage rated isolation inductors, generally represented by the numeral 500, may comprise a first inductive layer 560, a second inductive layer 558, an insulating dielectric layer 510 between the first and second inductive layers 560 and 558, respectively, and an insulating layer 108 over the second inductive layer 558 and a portion of the first inductive layer 560. First pad openings 514 may be used to provide electrical access to the first inductive layer 560. Second pad openings 516 may be used to provide electrical access to the second inductive layer 558. The high voltage rated isolation inductors 500 may be positioned over and attached to an insulating layer 104 deposed on an integrated circuit 102.

The first and second inductive layers 560 and 558, respectively, may comprise flat coils of a conductive metallic material such as, for example but is not limited to, aluminum, copper, titanium, tantalum, cobalt, molybdenum, silicides and salicides thereof, etc., and/or conductive non-metallic materials such as, for example but is not limited to, stacked layers of oxide-nitride-oxide (ONO), Titanium Nitride, etc. The insulating layer 104 may be, for example but is not limited to, silicon dioxide ($SiO_2$), silicon nitride, etc. The insulating dielectric layer 510 may be, for example but is not limited to, silicon dioxide ($SiO_2$), silicon nitride (SiN), $SiO_xN_y$, etc. The thickness of the insulating dielectric layer 510 may determine the voltage withstand capabilities of the high voltage rated isolation inductors 500, and may be, for example but is not limited to, about four (4) microns (μ) thick $SiO_2$ for about a 3,000 volt DC insulation breakdown voltage. The insulating layer 108 may be a protective passivation layer, e.g., silicon dioxide, silicon nitride, etc., having openings for connection to the low voltage pads 514 and the high voltage pads 516. The terms "high voltage pad" and "low voltage pad" refer to different voltage domains that have no direct current (DC) connections for power, ground or signals. The voltage differences may be large or small between voltage domains, and may further be used for protection from and isolation of devices subject to large voltage transients, e.g., sensors subject to induced electromotive force (EMF) voltages that may be caused by lightning, power switching transients, etc.

Referring now to FIG. 1D, the first inductive layer 560 of the high voltage rated isolation inductors 500 assembly may be connected to lead fingers 120 and/or connection pads on the integrated circuit 102, hereinafter "primary IC 102," with bond wires 524. The inductive layer 558 of the high voltage rated isolation inductors 500 assembly may be connected to connection pads on a second integrated circuit 118, hereinafter "secondary IC 118," and/or lead fingers 122 with bond wires 526. The secondary IC 118 may be connected to the lead fingers 122 with bond wires 128. The primary IC 102 may be configured to operate in a first voltage domain, and the secondary IC 118 may be configured to operate in a second voltage domain. The ground and voltage potentials between the first and second voltage domains may be thousands of volts different, only limited by the voltage withstand (breakdown) of the insulating dielectric layer 510, e.g., thickness thereof. The lead fingers 120 may be coupled to the first voltage domain, and the lead fingers 122 may be coupled to the second voltage domain. The primary IC 102, the high voltage rated isolation inductors 500, secondary IC 118, and portions of the lead fingers 120 and 122 may be encapsulated in an integrated circuit package 130a, e.g., epoxy. Die paddles, if used, are not shown for illustrative clarity.

The high voltage rated isolation inductors 500 may be formed with four (4) process masks: 1) a first metal (first inductive layer 560), 2) a second metal (second inductive layer 558), 3) low voltage pads 514, and 4) a passivation opening. It is contemplated and within the scope of this disclosure that other process fabrications steps may be used with equal success, and one having ordinary skill in the art of integrated circuit fabrication and the benefit of this disclosure could come up with such alternate designs and still be within the spirit and intent of this disclosure.

Figure 1F:
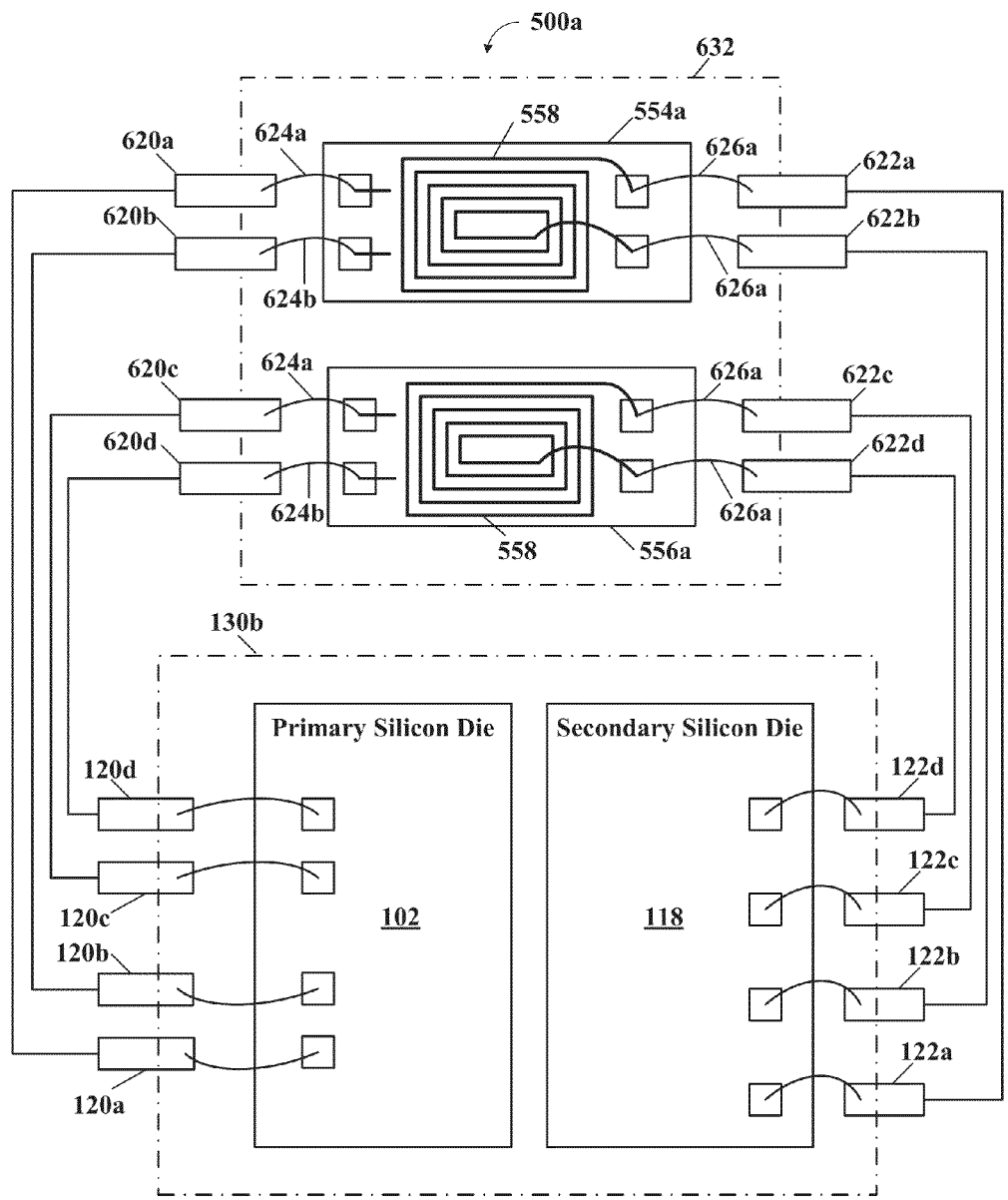
FIG. 1F illustrates a schematic plan view diagram of high voltage rated isolation inductors that are coupled to first and second integrated circuit dice in at least one integrated circuit package, according to still another specific example embodiment of this disclosure.

Referring to FIG. 1F, depicted is a schematic plan view diagram of high voltage rated isolation inductors that are coupled to first and second integrated circuit dice in at least one integrated circuit package, according to still another specific example embodiment of this disclosure. High voltage rated isolation inductors, generally represented by the numeral 500a, may be separately packaged from the primary and secondary silicon dice that may be packaged in an at least one integrated circuit package 130b. The high voltage rated isolation inductors 500a may be fabricated in substantially the same way as the inductors 500 shown in FIGS. 1D and 1E, e.g., on a scrap integrated circuit die. A first coil 560 (FIG. 1D) of the inductor 500a may be coupled to the primary silicon die 102 that may be in a first voltage domain. A second coil 558 may be coupled to the secondary silicon die 118 that may be in a second voltage domain. Connections between the at least one integrated circuit package 130b and the isolation inductor integrated circuit package 632 may be with external connections 120, 122, 620 and 622 (e.g., "pins") of the integrated circuit packages 130b and 632. These external connections 120, 122, 620 and 622 may provide electrical connections between the primary and secondary silicon dice 102 and 118, respectively, and the first and second coils 560 and 558, respectively, of the inductor(s) 500a. The external connections 120, 122, 620 and 622 of the integrated circuit packages 130b and 500a may be coupled together as desired with conductive traces on a printed circuit board (not shown).

Figure 2:
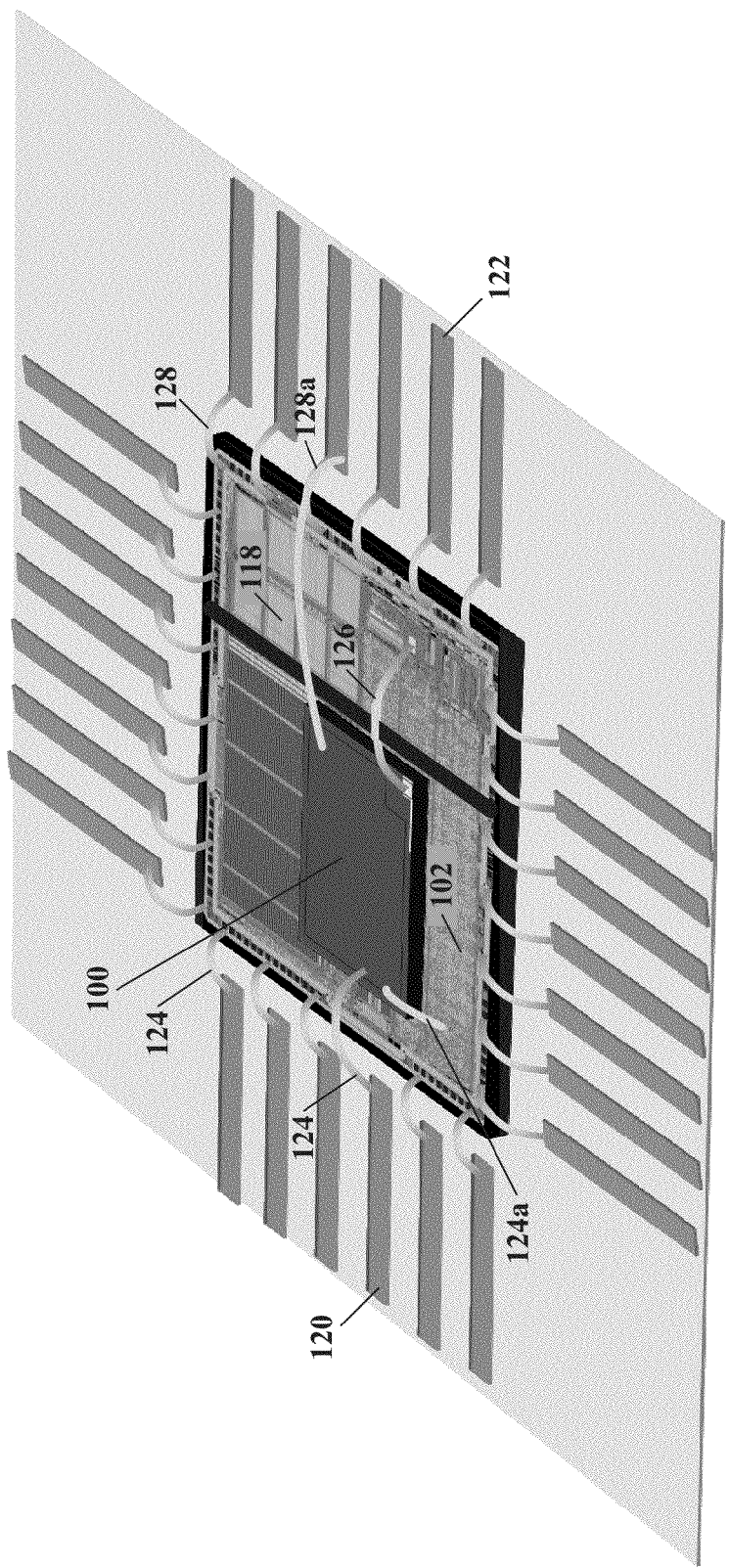
FIG. 2 illustrates a schematic orthogonal view diagram of a high voltage rated isolation device formed on an integrated circuit, according to specific example embodiments of this disclosure.

Referring to FIG. 2, depicted is a schematic orthogonal view diagram of a high voltage rated isolation capacitor formed on an integrated circuit, according to specific example embodiments of this disclosure. The high voltage rated isolation capacitor 100 is shown attached to the primary IC 102 and connected to some of the lead fingers 120 with bond wires 124, the primary IC 102 with bond wires 124a, the secondary IC 118 with bond wires 126, and/or the lead fingers 122 with bond wires 126a. The high voltage rated isolation capacitor 100 may be attached to an insulating layer 104, e.g., passivation layer, on a face of the primary IC 102.

Figure 3:
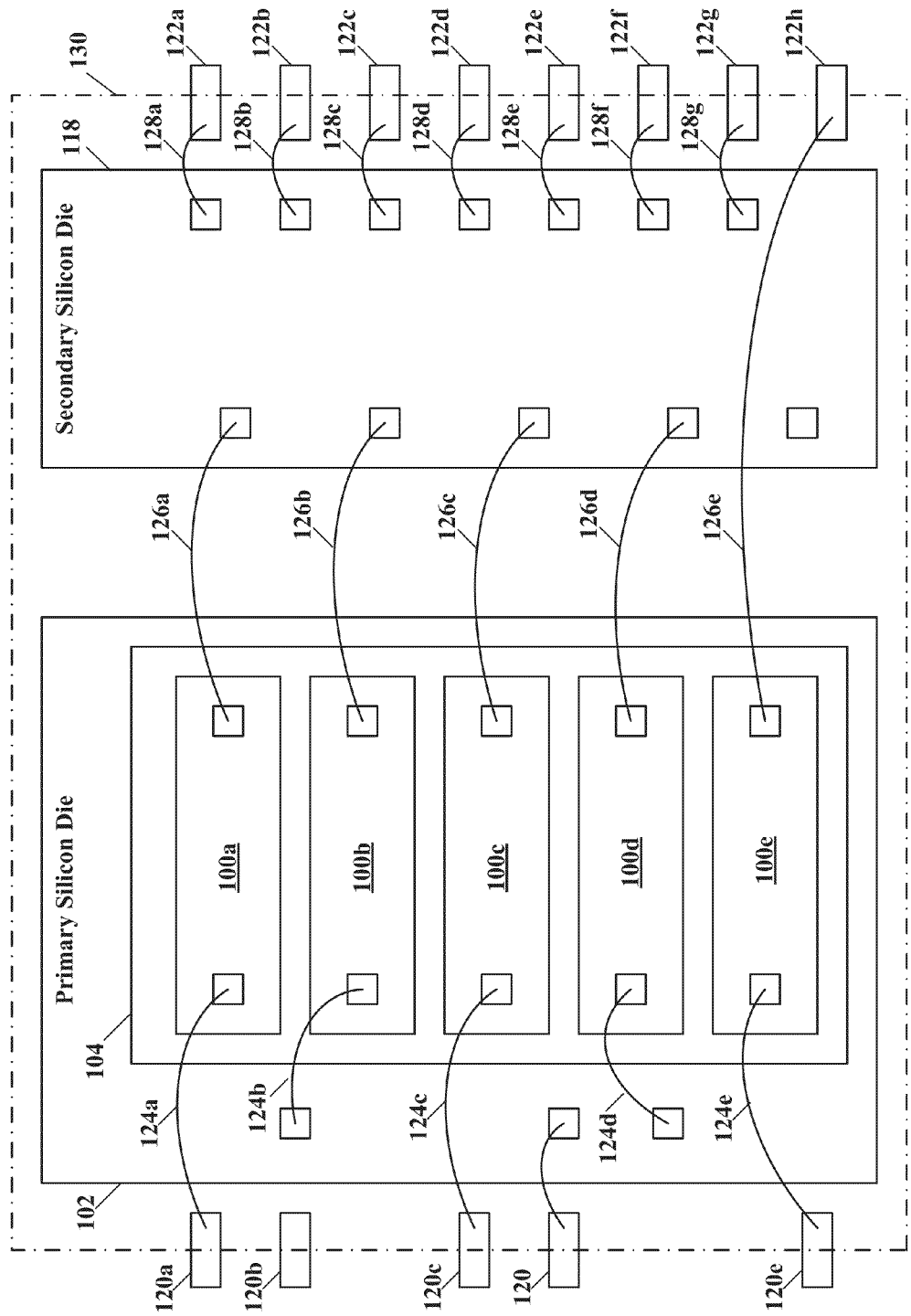
FIG. 3 illustrates a schematic plan view diagram of a plurality of high voltage rated isolation capacitors formed on a primary integrated circuit and coupled to a secondary integrated circuit, according to specific example embodiments of this disclosure.

Referring to FIG. 3, depicted is a schematic plan view diagram of a plurality of high voltage rated isolation capacitors formed on a primary integrated circuit and coupled to a secondary integrated circuit, according to specific example embodiments of this disclosure. A plurality of high voltage rated isolation capacitors 100 may be deposed over the primary IC 102 on an insulating layer 104 (FIGS. 1 and 1A). Each of the plurality of high voltage rated isolation capacitors 100 may be used to direct current (DC) isolate a lead finger 120 in a first voltage domain from a signal or power pad of the secondary IC 118 in a second voltage domain (e.g., lead finger 120a, bond wire 124a, isolation capacitor 100a, bond wire 126a and connection pad of secondary IC 118). From a signal pad of the primary IC 102 to a signal pad of the secondary IC 118 (e.g., bond wire 124b, isolation capacitor 100b, bond wire 126b and connection pad of secondary IC 118). From a lead finger 120e in the first voltage domain to a lead finger 122h in the second voltage (e.g., bond wire 124e, isolation capacitor 100e, bond wire 126e and lead finger 122h).

A plurality of high voltage rated isolation capacitors 100 may be connected as necessary for a particular application. Each of the high voltage rated isolation capacitors 100 may be formed as shown in FIGS. 1 and 1A and described hereinabove. It is contemplated and with the scope of this disclosure that the high voltage rated isolation capacitors 100 may be formed in any geometric shape desired and they are not limited to square or rectangular shapes as shown in the specific example embodiment shown in FIG. 3.

Figure 4:
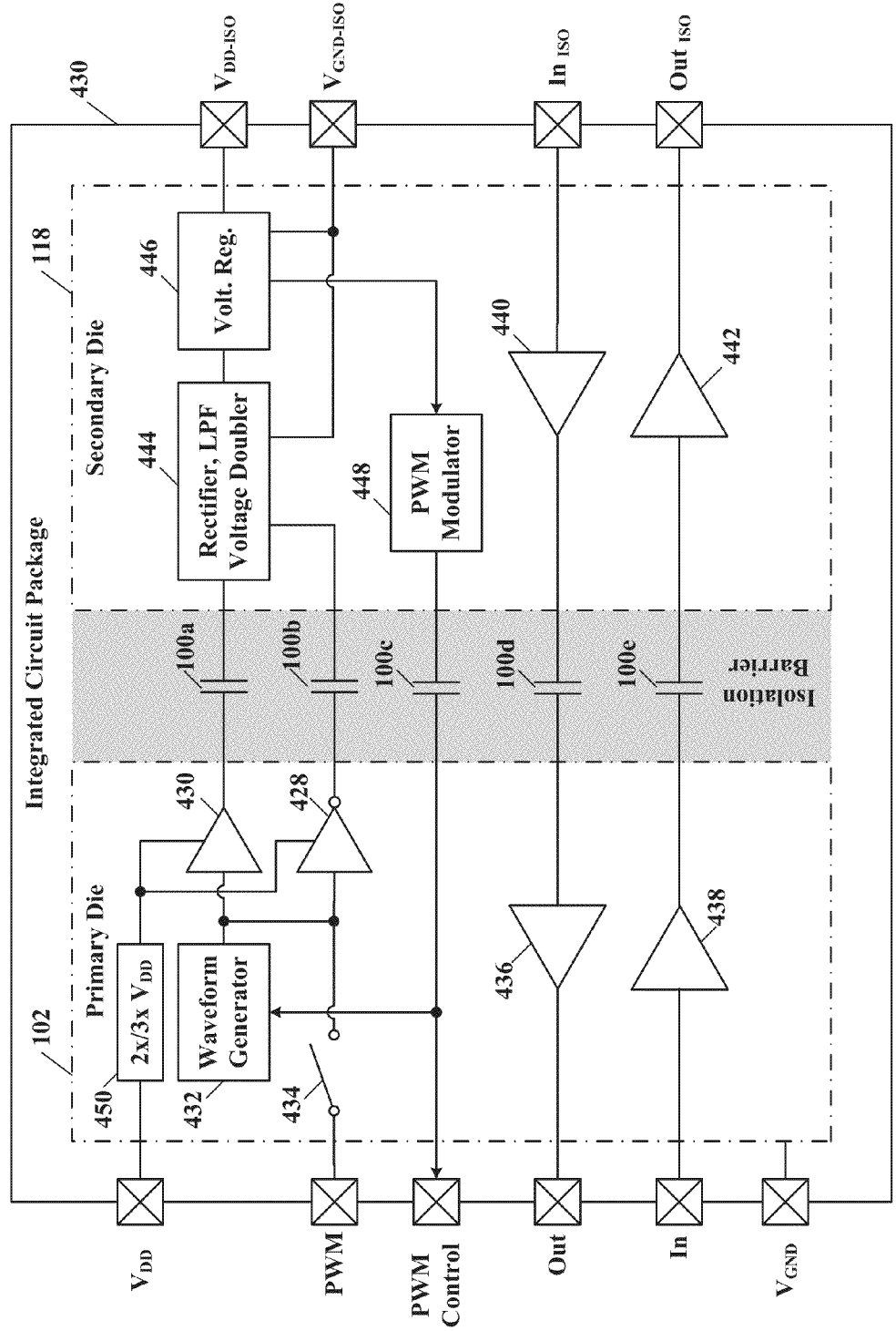
FIG. 4 illustrates a schematic block diagram of a plurality of high voltage rated isolation capacitors coupling power and signal circuits between a primary integrated circuit and a secondary integrated circuit, according to specific example embodiments of this disclosure.

Referring to FIG. 4, depicted is a schematic block diagram of a plurality of high voltage rated isolation capacitors coupling power and signal circuits between a primary integrated circuit and a secondary integrated circuit wherein the circuits of the secondary integrated circuit control power transfer from the primary integrated circuit to the secondary integrated circuit, according to another specific example embodiment of this disclosure. Power may be isolated and transferred from the first voltage domain to the second voltage domain, or visa-versa, using an alternating current (AC) voltage through high voltage rated isolation capacitors 100, e.g., isolation capacitors 100a and 100b. This AC voltage may be generated by a waveform generator 432, e.g., oscillator, power switches controlled by pulse width modulation (PWM) modulator, etc., or an external pulse width modulation (PWM) signal when a switch 434 is closed and the waveform generator 432 is inactive. The waveform generator 432 provides an AC voltage to drivers 430 and 428, and the drivers 430 and 428 may provide a push-pull (e.g., differential signal) waveform not requiring a ground reference through the isolation capacitors 100a and 100b, and to a rectifier 444 in the second voltage domain. The rectifier 444 may also comprise a low pass filter and voltage doubler.

Higher AC voltage amplitudes may be generated from the primary IC 102 by using a voltage doubler/tripler 450. This higher AC voltage may be coupled to the drivers 430 and 428 to produce a drive power signal having a higher amplitude that will be isolation coupled to the rectifier 444 through the isolation capacitors 100. The rectifier 444 provides a DC voltage to a voltage regulator 446 that provides a power source voltage in the second voltage domain. The voltage regulator 446 also provides an error voltage between an internal voltage reference (not shown) and the isolated voltage $V_{DD\text{-}ISO}$ to a PWM modulator 448. The output of the PWM modulator 448 provides a feedback control signal through isolation capacitor 100c to the waveform generator 432 or an external PWM generator (not shown). From this feedback control signal the waveform generator 432 may vary its output amplitude and/or frequency to maintain a desired isolated voltage $V_{DD\text{-}ISO}$, e.g., for the secondary IC 118. Thus an isolated, highly efficient, regulated voltage may be provided from the first voltage domain to the second voltage domain. Isolated inputs from the first voltage domain may be received, for example, by an input circuit 438 and isolation coupled through the isolation capacitor 100e to an output driver circuit 444 to the second voltage domain. Similarly, isolated inputs from the second voltage domain may be received, for example, by an input circuit 442 and isolation coupled through the isolation capacitor 100d to an output driver circuit 436 to the first voltage domain.

It should be noted that the supply voltage ($V_{DD}$) in the first voltage domain is transferred as AC energy using an internal waveform generator 432, and transferred to the second voltage domain side across the isolation barrier through the isolation capacitors 100a and 100b. The DC supply voltage ($V_{DD\text{-}ISO}$) may be developed from the rectified AC signal from the isolation capacitors 100a and 100b, and regulated through a feedback circuit that is formed by the PWM modulator 448 and feedback isolation coupling capacitor 100c.

The waveform generator 432 may also be a PWM generator controlled by the PWM modulator 448. It is contemplated and within the scope of this disclosure that an external PWM generator (not shown) may be used and controlled by the PWM modulator 448.

Figure 5:
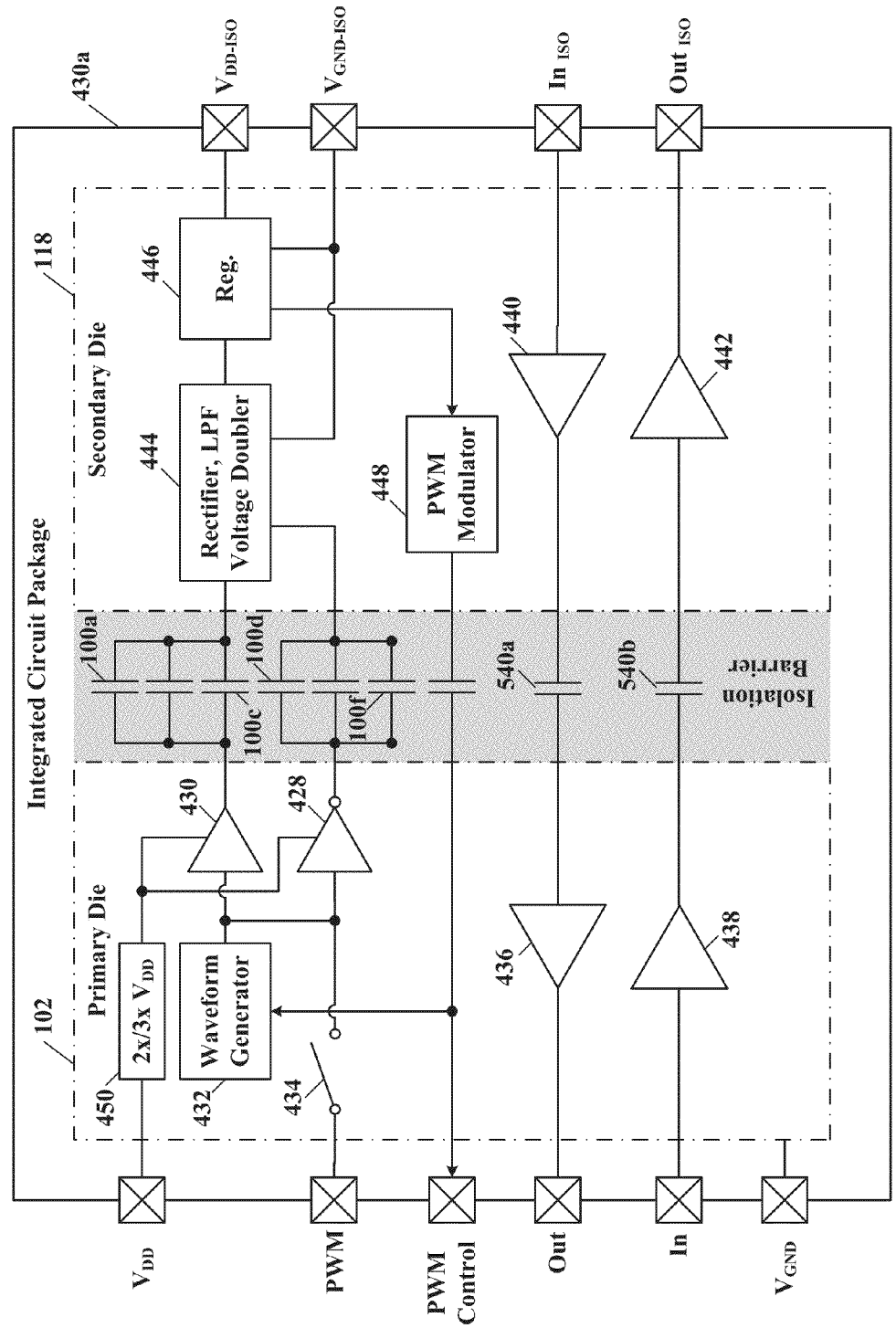
FIG. 5 illustrates a schematic block diagram of a plurality of high voltage rated isolation capacitors coupling power and signal circuits between a primary integrated circuit and a secondary integrated circuit wherein the circuits of the secondary integrated circuit control power transfer from the primary integrated circuit to the secondary integrated circuit, according to still another specific example embodiment of this disclosure.

Referring to FIG. 5, depicted is a schematic block diagram of a plurality of high voltage rated isolation capacitors coupling power and signal circuits between a primary integrated circuit and a secondary integrated circuit, according to specific example embodiments of this disclosure. Power may be isolated and transferred from the first voltage domain to the second voltage domain, or visa-versa, using an alternating current (AC) voltage through a plurality of high voltage rated isolation capacitors 100, e.g., isolation capacitors 100a-100f. This AC voltage may be generated by a waveform generator 432, e.g., oscillator, power switches controlled by pulse width modulation (PWM) modulator, etc., or an external pulse width modulation (PWM) signal. Drivers 430 and 428 provide a push-pull (e.g., differential signal) waveform not requiring a ground reference through the isolation capacitors 100a-100f to a rectifier 444 connected in the second voltage domain. The rectifier 444 may also comprise a low pass filter and voltage doubler. The circuit shown in FIG. 5 works in substantially the same way as the circuit shown in FIG. 4 except that the parallel connected capacitors 100a-100f lower the impedances therethrough, and increase current throughput.

Figure 6:
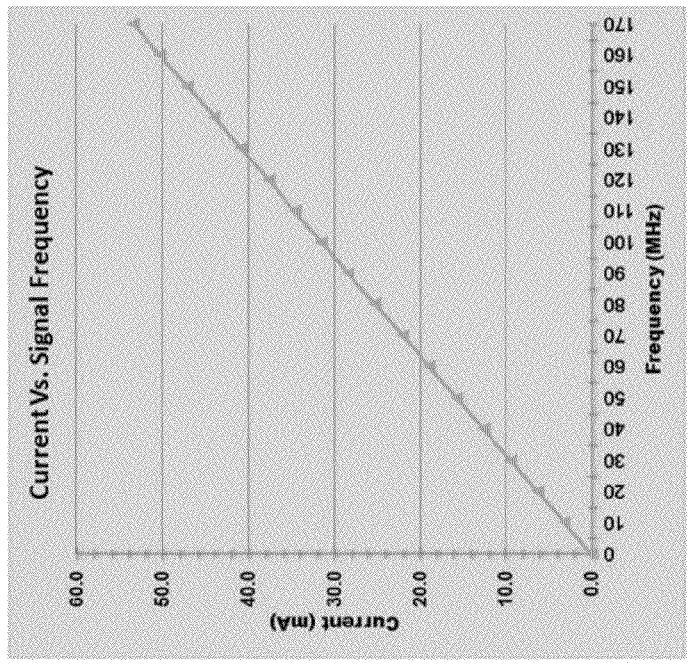
FIG. 6 illustrates a table and a graph of the current carrying capabilities of a 10 picofarad (pF) capacitor versus signal frequency applied thereto, according to the teachings of this disclosure.

Referring to FIG. 6, depicted are a table and a graph of the current carrying capabilities of a 10 picofarad (pF) capacitor versus signal frequency applied thereto, according to the teachings of this disclosure. The isolation capacitors 100 may preferably have a capacitance value of about 10 picofarads. The table and graph shown in FIG. 6 provide current carrying capabilities at different frequencies for a 10 pF capacitor. When one 10 pF capacitor cannot supply a sufficient amount of current at a desired frequency then adding additional parallel connected isolation capacitors 100 may be appropriate, e.g., see FIG. 5, isolation capacitors 100a-100f.

In lieu of or in addition to paralleling isolation capacitors 100, higher AC voltage amplitude may be generated from the primary 102 by using a voltage doubler/tripler 450. This higher AC voltage may be coupled to the drivers 430 and 428 to produce a drive power signal having greater amplitude that will be isolation coupled to the charge pump 444 through the isolation capacitors 100.

Referring back to FIG. 5, low level signals from signal output drivers to signal input drivers may have much lower signal current requirements, e.g., higher impedances. Therefore, smaller value capacitors may be effectively used, e.g., about one (1) pF. Capacitors 540 may be of the same construction as the isolation capacitors 100, or constructions know in the integrated circuit fabrication arts. Any capacitor blocks DC so preferably signal data transfers between circuits in the first and second voltage domains will be edge triggered with latches or registers for long term data logic level retention. These isolation capacitors 100 may also be used for power supply applications in microcontrollers and other analog products and are not limited only to isolation devices.

Figure 5A:
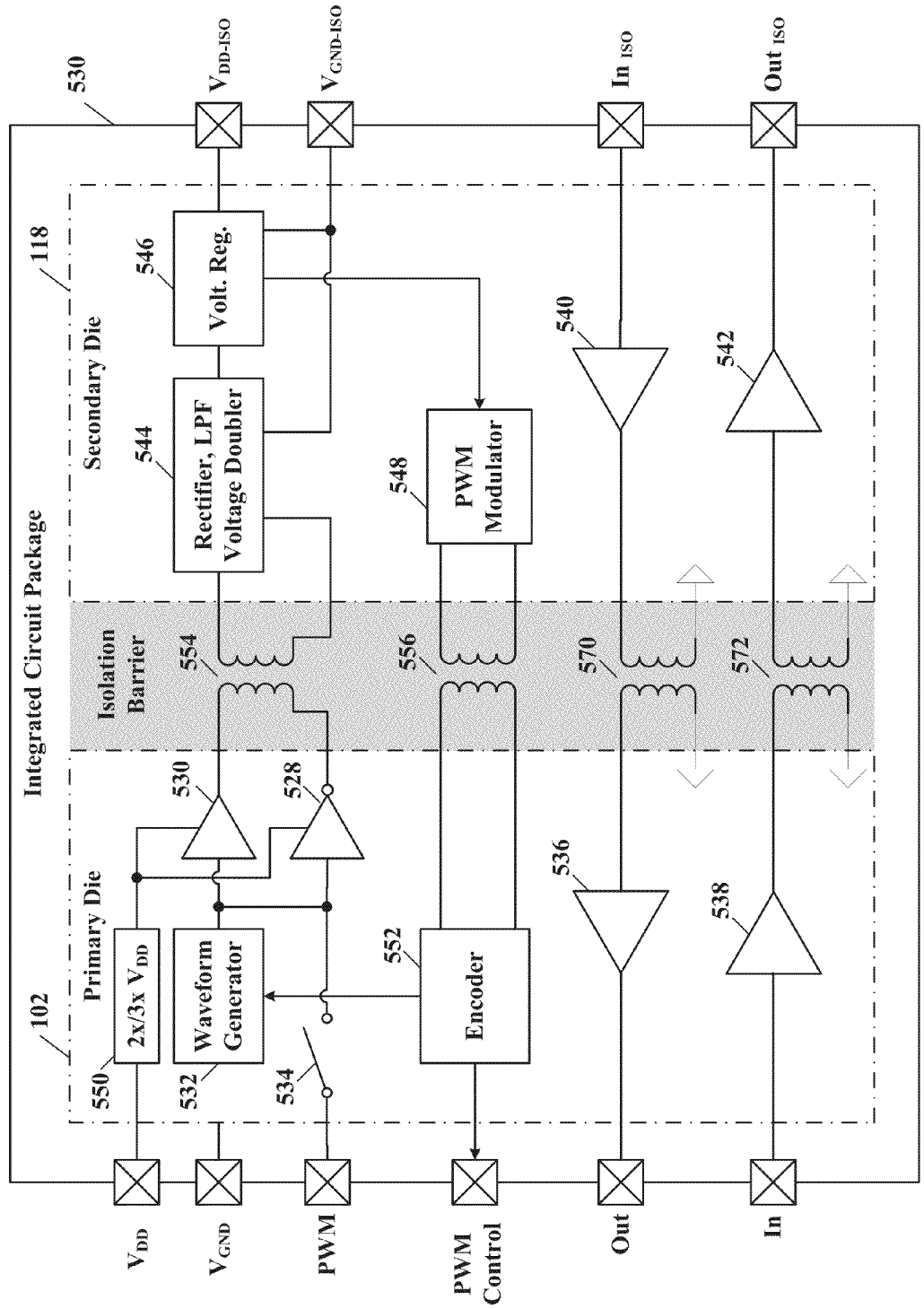
FIG. 5A illustrates a schematic block diagram of a plurality of high voltage rated isolation inductors coupling power and control circuits between a primary integrated circuit and a secondary integrated circuit, according to specific example embodiments of this disclosure.

Referring to FIG. 5A, depicted is a schematic block diagram of a plurality of high voltage rated isolation inductors coupling power and control circuits between a primary integrated circuit and a secondary integrated circuit, according to specific example embodiments of this disclosure. Power may be isolated and transferred from the first voltage domain to the second voltage domain, or visa-versa, using an alternating current (AC) voltage through high voltage rated isolation inductors 560 and 558 (FIGS. 1B and 1C) inductively coupled to form a transformer 554. This AC voltage may be generated by a waveform generator 532, e.g., oscillator, power switches controlled by pulse width modulation (PWM) modulator, etc., or an external pulse width modulation (PWM) signal. The waveform generator 432 provides an AC voltage to drivers 530 and 528, and the drivers 530 and 528 provide a push-pull (e.g., differential waveform) AC voltage from the first voltage domain, through the isolation inductors 560 and 558 (transformer 554), and to a rectifier 544 connected in the second voltage domain. The rectifier 544 may also comprise a low pass filter and voltage doubler.

Higher AC voltage amplitudes may be generated from the primary 102 by using a voltage doubler/tripler 550. This higher AC voltage may be coupled to the drivers 530 and 528 to produce a drive power signal having greater amplitude that will be isolation coupled to the rectifier 544 through the isolation inductors 560 and 558 (transformer 554). The rectifier 544 provides a DC voltage to a voltage regulator 546 that provides a power source voltage in the second voltage domain. The voltage regulator 546 also provides an error voltage between an internal voltage reference (not shown) and the isolated voltage $V_{DD\text{-}ISO}$ to a PWM modulator 548. The output of the PWM modulator 548 provides a feedback control signal through isolation inductors (transformer 556) to an encoder 552. From this feedback control signal the encoder 552 may control the waveform generator 532 to vary its output amplitude and/or frequency to maintain a desired isolated voltage for the secondary IC 118. Thus an isolated, highly efficient, regulated voltage may be provided from the first voltage domain to the second voltage domain. Isolated input and output signals between the two voltage domains may be provided as shown through isolation transformers 570 and 572, and interface circuits 536, 538, 540 and 542.

It should be noted that the supply voltage ($V_{DD}$) in the first voltage domain is transferred as AC energy using an internal waveform generator 532, and transferred to the second voltage domain side across the isolation barrier through the isolation transformer 554. The DC supply voltage ($V_{DD\text{-}ISO}$) may be developed from the rectified AC signal from the isolation transformer 554, and regulated through a feedback circuit that is formed by the PWM modulator 548 and feedback isolation transformer 556.

The waveform generator 532 may also be a PWM generator controlled by the PWM modulator 548. It is contemplated and within the scope of this disclosure that an external PWM generator (not shown) may be used and controlled by the PWM modulator 548.

Figure 7:
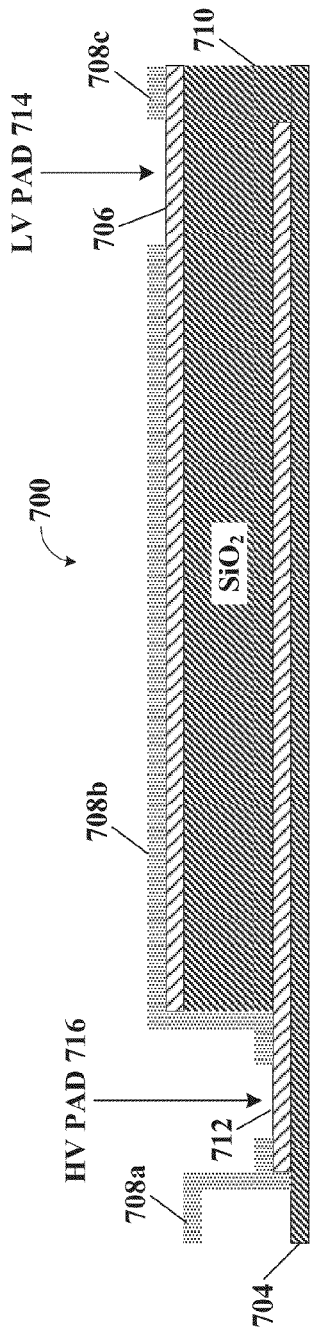
FIGS. 7 and 7A illustrate schematic elevational view diagrams of a plurality of inverse stacked high voltage rated isolation capacitors formed on an integrated circuit, according to another specific example embodiment of this disclosure.
Figure 7A:
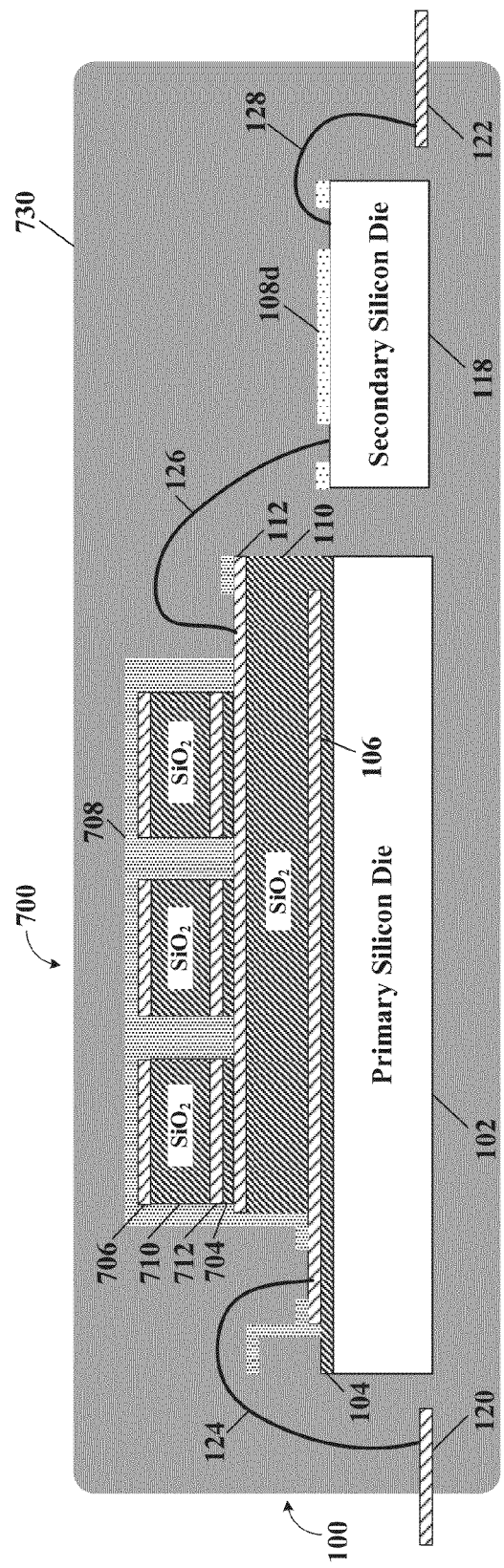

Referring to FIGS. 7 and 7A, depicted are schematic elevational view diagrams of a plurality of inverse stacked high voltage rated isolation capacitors formed on an integrated circuit, according to another specific example embodiment of this disclosure. Another high voltage rated isolation capacitor, generally represented by the numeral 700, may comprise an insulating layer 704 over the second electrically conductive layer 112, a third conductive layer 712 over the insulating layer 704, an insulating dielectric layer 710 over a portion of the third conductive layer 712, a fourth conductive layer 706 over the insulating dielectric layer 710, and an insulating layer 708 over the fourth conductive layer 706 and a portion of the third conductive layer 712. A third pad opening 716 in the insulating layer 708 may provide electrical connection access to the third conductive layer 712. A fourth pad opening 714 in the insulating layer 708 may provide electrical connection access to the fourth conductive layer 706, The high voltage rated isolation capacitor(s) 700 may be positioned over and attached to the high voltage rated isolation capacitor(s) 100 deposed on the integrated circuit 102. Construction of the high voltage rated isolation capacitor(s) 700 may be substantially the same as the high voltage rated isolation capacitor(s) 100 except that the third and fourth conductive layers 712 and 706, respectively, may be inverted so that a less thick electrical insulation (e.g., electrical insulating layer 704) has to be placed between the isolation capacitors 100 and 700 in order to maintain a desired voltage break down rating between the first and second voltage domains. The primary and secondary ICs 102 and 118, and the isolation capacitors 100 and 700 may be encapsulated (packaged) in an integrated circuit package 730.

Figure 8:
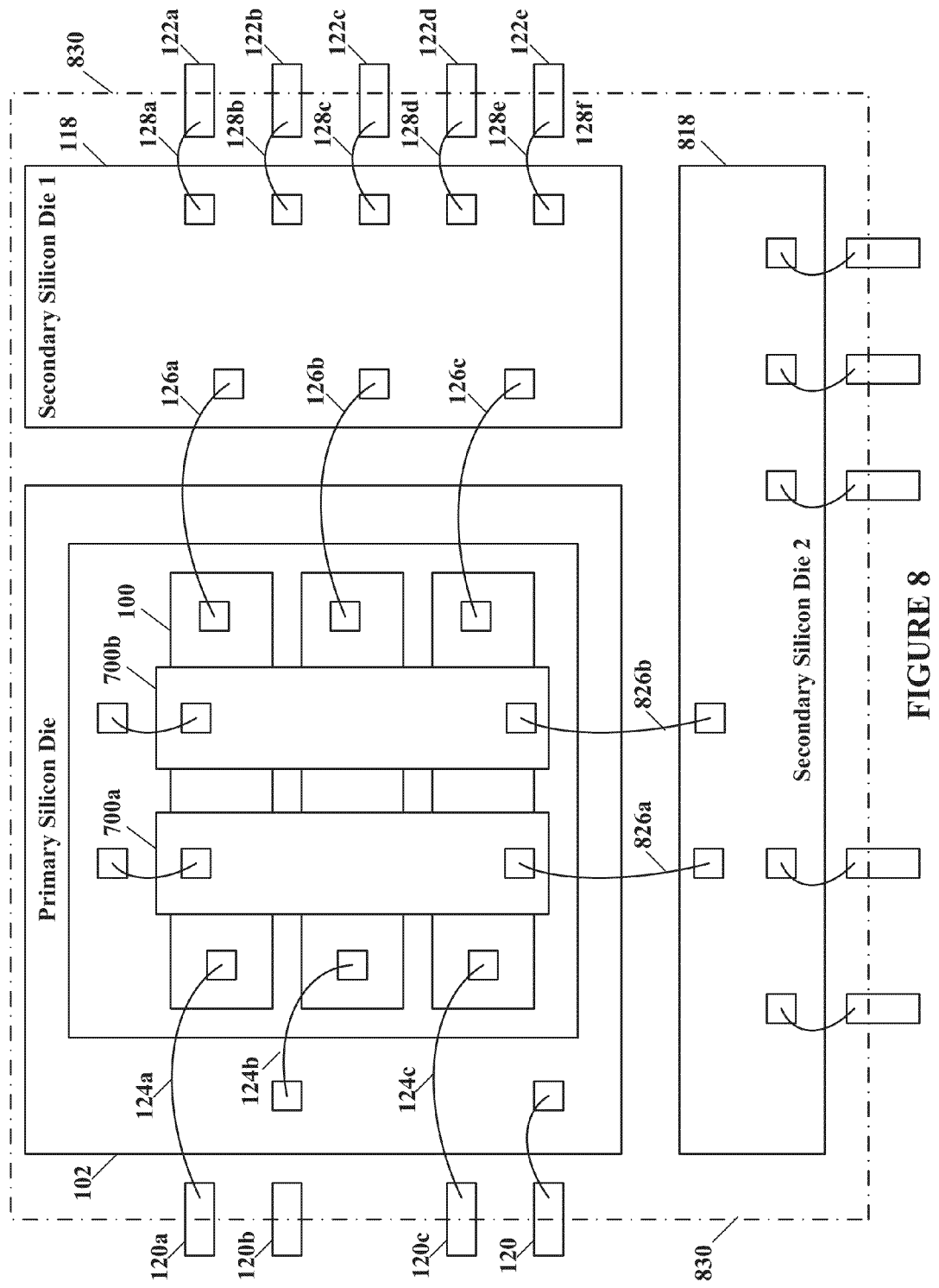
FIG. 8 illustrates a schematic plan view diagram of a plurality of high voltage rated isolation capacitors formed on a primary integrated circuit and coupled to first and second secondary integrated circuits, according to another specific example embodiment of this disclosure.

Referring to FIG. 8, depicted is a schematic plan view diagram of a plurality of high voltage rated isolation capacitors formed on a primary integrated circuit and coupled to first and second secondary integrated circuit, according to another specific example embodiment of this disclosure. The isolation capacitors 100 and 700 may be placed perpendicular to each other and another secondary IC 818 may be coupled to the isolation capacitors 700. This allows two or more secondary ICs to be packaged, e.g., IC package 830, with the primary IC 102. The secondary ICs 118 and 818 may both be in a second voltage domain, or the secondary IC 118 may be in the second voltage domain and the secondary IC 818 may be in the third voltage domain, wherein both secondary ICs 118 and 818 may be completely isolated from the primary IC 102 in the first voltage domain. In addition, the secondary ICs 118 and 818 may be isolated from each other when configured in second and third voltage domains. The primary IC 102 may comprise a microcontroller, etc., and the secondary ICs 118/818 may be digital signal processors (DSP), charge time measurement units (CTMU), co-processors, specialized input output interfaces, counters, timers, analog-to-digital converters (ADC), digital-to-analog converters (DAC), etc. The primary and secondary ICs 102, 118 and 818, and the isolation capacitors 100 and 700 may be encapsulated (packaged) in an integrated circuit package 830.

A plurality of high voltage rated isolation capacitors 100 and 700 may be connected as necessary for a particular application. Each of the high voltage rated isolation capacitors 100 and 700 may be formed as shown in FIGS. 7 and 7A and described hereinabove. It is contemplated and with the scope of this disclosure that the high voltage rated isolation capacitors 100 and 700 may be formed in any geometric shape desired and they are not limited to square or rectangular shapes as shown in the specific example embodiment shown in FIGS. 3 and 8.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

What is claimed is:

1. A method for generating regulated isolation supply voltage between different voltage domains, said method comprising the steps of:
    providing a primary integrated circuit coupled to a first voltage domain;
    providing a secondary integrated circuit coupled to a second voltage domain;
    providing a first insulating layer over at least a portion of a face of the primary integrated circuit;
    providing a plurality of high voltage rated isolation capacitors positioned over the first insulating layer, wherein each of the plurality of high voltage rated isolation capacitors comprises
        a first electrically conductive layer on the first insulating layer,
        a high voltage rated dielectric layer on a portion of a respective first electrically conductive layers, and
        a second electrically conductive layer on the respective high voltage rated dielectric layer;

providing a waveform generator in the primary integrated circuit die, the waveform generator having outputs coupled to respective ones of the first electrically conductive layers;

providing an alternating current (AC)-to-direct current (DC) converter in the secondary integrated circuit and having inputs coupled to respective ones of the second electrically conductive layers, whereby AC power is transferred from the waveform generator to the AC-to-DC converter;

providing a voltage regulator coupled to an output of the AC-to-DC converter, the voltage regulator having a reference voltage feedback output; and providing a pulse width modulator having an input coupled to the voltage regulator reference voltage feedback output and an output coupled to another second electrically conductive layer, wherein the waveform generator has a control input coupled to a respective another first electrically conductive layer, whereby the pulse width modulator controls the output of the waveform generator.

2. A method for generating regulated isolation supply voltage between different voltage domains, said method comprising the steps of:

providing a primary integrated circuit coupled to a first voltage domain;

providing a secondary integrated circuit coupled to a second voltage domain;

providing a first insulating layer over at least a portion of a face of the primary integrated circuit;

providing a plurality of high voltage rated isolation transformers positioned over the first insulating layer, wherein each of the plurality of high voltage rated isolation transformers comprises
a first inductor on the first insulating layer,
a high voltage rated dielectric layer on a portion of a respective first inductor, and
a second inductor on the respective high voltage rated dielectric layer;

providing a waveform generator in the primary integrated circuit die, the waveform generator having outputs coupled to respective ones of the first inductor;

providing an alternating current (AC)-to-direct current (DC) converter in the secondary integrated circuit and having inputs coupled to respective ones of the second inductor, whereby AC power is transferred from the waveform generator to the AC-to-DC converter;

providing a voltage regulator coupled to an output of the AC-to-DC converter, the voltage regulator having a reference voltage feedback output; and providing a pulse width modulator having an input coupled to the voltage regulator reference voltage feedback output and an output coupled to another second inductor, wherein the waveform generator has a control input coupled to a respective another first inductor, whereby the pulse width modulator controls the output of the waveform generator.

3. An integrated circuit device having regulated isolation supply voltage between different voltage domains, comprising:

a primary integrated circuit coupled to a first voltage domain;

a secondary integrated circuit coupled to a second voltage domain;

a first insulating layer over at least a portion of a face of the primary integrated circuit;

a plurality of high voltage rated isolation capacitors positioned over the first insulating layer, wherein each of the plurality of high voltage rated isolation capacitors comprises
a first electrically conductive layer on the first insulating layer,
a high voltage rated dielectric layer on a portion of a respective first electrically conductive layers, and
a second electrically conductive layer on the respective high voltage rated dielectric layer;

a waveform generator in the primary integrated circuit die, the waveform generator having outputs coupled to respective ones of the first electrically conductive layers;

an alternating current (AC)-to-direct current (DC) converter in the secondary integrated circuit and having inputs coupled to respective ones of the second electrically conductive layers, whereby AC power is transferred from the waveform generator to the AC-to-DC converter;

a voltage regulator coupled to an output of the AC-to-DC converter, the voltage regulator having a reference voltage feedback output; and a pulse width modulator having an input coupled to the voltage regulator reference voltage feedback output and an output coupled to another second electrically conductive layer, wherein the waveform generator has a control input coupled to a respective another first electrically conductive layer, whereby the pulse width modulator controls the output of the waveform generator.

4. The integrated circuit device according to claim 3, further comprising push-pull drivers in the primary integrated circuit die, having inputs coupled to the waveform generator and outputs coupled to respective ones of the first electrically conductive layers.

5. The integrated circuit device according to claim 3, further comprising a second insulating layer over at least a portion of the second electrically conductive layers, over portions of the high voltage rated dielectric layers and the first electrically conductive layers, wherein the second insulating layer has
first openings over the first electrically conductive layers for first bond wires to couple the first electrically conductive layers to circuit connection pads on the primary integrated circuit, and
second openings over the second electrically conductive layers for second bond wires to couple the second electrically conductive layers to circuit connection pads on the secondary integrated circuit.

6. The integrated circuit device according to claim 3, further comprising an integrated circuit package encapsulating the primary and secondary integrated circuit and the high voltage rated isolation capacitors.

7. The integrated circuit device according to claim 3, wherein the primary integrated circuit is a microcontroller.

8. The integrated circuit device according to claim 3, wherein the high voltage rated dielectric layer comprises silicon dioxide ($SiO_2$).

9. The integrated circuit device according to claim 3, wherein the high voltage rated dielectric layers each have a thickness of about four (4) microns ($\mu$).

10. The integrated circuit device according to claim 3, wherein the high voltage rated isolation capacitors each have a capacitance value of about 10 picofarads.

11. The integrated circuit device according to claim 3, wherein the first and second electrically conductive layers are metal.

12. The integrated circuit device according to claim 11, wherein the first and second electrically conductive metal layers are comprised of aluminum.

13. The integrated circuit device according to claim 1, wherein each of the outputs of the push-pull drivers is coupled to at least two of the first electrically conductive layers, and corresponding at least two second electrically conductive layers are coupled to the AC-to-DC converter.

14. The integrated circuit device according to claim 3, wherein the waveform generator is an oscillator and the pulse width modulator controls the output amplitude thereof.

15. The integrated circuit device according to claim 3, wherein the waveform generator is an oscillator and the pulse width modulator controls the output frequency thereof.

16. The integrated circuit device according to claim 4, further comprising a voltage multiplier coupled between a voltage source in the first voltage domain and supplying a multiplied operating voltage to the push-pull drivers.

17. The integrated circuit device according to claim 16, wherein the voltage multiplier multiplies the voltage source by two.

18. The integrated circuit device according to claim 16, wherein the voltage multiplier multiplies the voltage source by three.

19. The integrated circuit device according to claim 3, wherein the AC-to-DC converter further comprises a low pass filter.

20. The integrated circuit device according to claim 3, wherein the AC-to-DC converter further comprises a voltage doubler.

21. The integrated circuit device according to claim 3, wherein the waveform generator comprises power switches and the pulse width modulator controls on and off duty cycles of the power switches.

22. An integrated circuit device having regulated isolation supply voltage between different voltage domains, comprising:
a primary integrated circuit coupled to a first voltage domain;
a secondary integrated circuit coupled to a second voltage domain;
a first insulating layer over at least a portion of a face of the primary integrated circuit;
a plurality of high voltage rated isolation transformers positioned over the first insulating layer, wherein each of the plurality of high voltage rated isolation transformers comprises
a first inductor on the first insulating layer,
a high voltage rated dielectric layer on a portion of a respective first inductor, and
a second inductor on the respective high voltage rated dielectric layer;
a waveform generator in the primary integrated circuit die, the waveform generator having outputs coupled to respective ones of the first inductor;
an alternating current (AC)-to-direct current (DC) converter in the secondary integrated circuit and having inputs coupled to respective ones of the second inductor, whereby AC power is transferred from the waveform generator to the AC-to-DC converter;
a voltage regulator coupled to an output of the AC-to-DC converter, the voltage regulator having a reference voltage feedback output; and
a pulse width modulator having an input coupled to the voltage regulator reference voltage feedback output and an output coupled to another second inductor, wherein the waveform generator has a control input coupled to a respective another first inductor, whereby the pulse width modulator controls the output of the waveform generator.

23. The integrated circuit device according to claim 22, further comprising push-pull drivers in the primary integrated circuit die, having inputs coupled to the waveform generator and outputs coupled to respective ones of the first inductors.

24. The integrated circuit device according to claim 22, further comprising a second insulating layer over at least a portion of the second inductors, over portions of the high voltage rated dielectric layers and the first inductors, wherein the second insulating layer has
first openings over the first electrically conductive layers for first bond wires to couple the first inductors to circuit connection pads on the primary integrated circuit, and
second openings over the second electrically conductive layers for second bond wires to couple the second inductors to circuit connection pads on the secondary integrated circuit.

25. The integrated circuit device according to claim 22, further comprising an integrated circuit package encapsulating the primary and secondary integrated circuit and the high voltage rated isolation transformers.

26. The integrated circuit device according to claim 22, wherein the primary integrated circuit is a microcontroller.

27. The integrated circuit device according to claim 22, wherein the high voltage rated dielectric layer comprises silicon dioxide ($SiO_2$).

28. The integrated circuit device according to claim 22, wherein the high voltage rated dielectric layers each have a thickness of about four (4) microns ($\mu$).

29. The integrated circuit device according to claim 22, wherein the AC-to-DC converter further comprises a low pass filter.

30. The integrated circuit device according to claim 22, wherein the waveform generator comprises power switches and the pulse width modulator controls on and off duty cycles of the power switches.

* * * * *